United States Patent [19]
Lee et al.

[11] Patent Number: 5,883,419
[45] Date of Patent: Mar. 16, 1999

[54] ULTRA-THIN MO-C FILM TRANSISTOR

[75] Inventors: Seong-Jae Lee, Seoul; Kyoung-Wan Park; Min-Cheol Shin, both of Daejeon, all of Rep. of Korea

[73] Assignee: Electronics and Telecommunications Research Institute, Daejeon, Rep. of Korea

[21] Appl. No.: 850,013

[22] Filed: May 1, 1997

Related U.S. Application Data

[60] Division of Ser. No. 557,392, Nov. 13, 1995, abandoned, which is a continuation-in-part of Ser. No. 341,098, Nov. 17, 1994, abandoned.

[51] Int. Cl.$^6$ .............................. B02J 17/40; B05D 3/06
[52] U.S. Cl. .................... 257/417; 257/415; 257/416; 257/418; 257/420; 257/245; 257/254; 257/789; 257/295
[58] Field of Search ................................. 257/245, 254, 257/257, 295, 289, 415–420

[56] References Cited

U.S. PATENT DOCUMENTS

| | | | |
|---|---|---|---|
| 4,193,835 | 3/1980 | Inoue et al. ............................ | 438/197 |
| 4,604,159 | 8/1986 | Kaboyashi et al. ................. | 156/617 R |
| 4,605,566 | 8/1986 | Matsui et al. .......................... | 438/197 |

*Primary Examiner*—Tom Thomas
*Assistant Examiner*—Fetsum Abraham
*Attorney, Agent, or Firm*—Antonelli, Terry, Stout & Kraus, LLP

[57] ABSTRACT

A transistor in accordance with the invention comprises an ultra-thin Mo—C film functioning as a channel for an electron flow with two ends of the thin metal film functioning as source and drain terminals of the transistor, respectively; a piezoelectric film formed on the Mo—C film, for producing a force in accordance with an applied electric field provided by a gate voltage; and an electrode film formed on the piezoelectric film functioning as a gate of the transistor to which the gate voltage is applied to produce the applied electric field; and wherein a resistance of the Mo—C film between the source and drain terminals changes in accordance with the force produced in response to the applied gate voltage. This transistor can be used as an element of the three dimensional integrated circuit with a laminated structure.

5 Claims, 2 Drawing Sheets

ULTRA-THIN MO-C FILM TRANSISTOR

CROSS REFERENCE TO RELATED APPLICATIONS

This is a Divisional application of U.S. Ser. No. 08/557,392, filed Nov. 13, 1995 now abandoned; which is a Continuation In Part application of U.S. Ser. No. 08/341,098, filed Nov. 17, 1994, now abandoned.

BACKGROUND OF THE INVENTION

1. Field of the Invention

The present invention relates to an ultra-thin Mo—C film transistor utilizing the piezoelectric effect. More particularly, the invention relates to the novel structure of a transistor involving a piezoelectric film inserted between a gate electrode and an ultra-thin Mo—C film having a source and a drain electrodes at opposite ends thereof, wherein on electrical signal applied to a gate electrode modulates the current of the ultra-thin Mo—C film between the source and drain electrodes held at a constant voltage.

2. Description of Prior Art

A piezoelectric material has a linear relation between an electric field and a resulting mechanical stress/strain, and such materials have been utilized in a variety of piezoelectric devices. Most piezoelectric devices thus convert the mechanical stress/strain to an electrical signal, or vice versa. Insulators such as quartz, $LiNbO_3$, $BaTiO_3$, $PbTiO_3$ and the like, and semiconductors such as ZnS, InSb, CdS and the like, are known to be piezoelectric.

The simplest stress/strain transducer places a piezoelectric body in contact with the sensing area of the mechanical stress/strain and measures the electric potential difference between both surfaces of the piezoelectric body. This simple device converts a mechanical signal into a electrical potential signal.

In a more advanced form of a stress/strain transducer, a semiconductor material, such as Si, Ge, or the like, can be coupled to the piezoelectric material. The semiconductor material converts the electrical field caused by the piezoelectric material into a change in the semiconductor channel charge, resulting in a current modulation in a constant voltage mode.

Another form of such device is to employ a piezoresistive material which changes its resistivity according to mechanical forces. Some forms of semiconductor material, if properly processed, are known to exhibit such a piezoresistive effect.

As described above, most devices using a piezoelectric material convert a mechanical signal, represented by a stress or strain, into a electrical signal in one form or other.

Most electronic devices are mainly comprised of semiconductors and are being developed to meet the demands of increased capacity, i.e., higher integration. However, the involved technologies have many problems related to the integration capacity of the semiconductor-based device elements, with respect to nanometer-scale processing technology and the parasitic effects originating from the quantum effect as the device element become smaller than 10 nm. One way to solve this problem is to devise a three dimensional integrated circuit and to develop the device element suited for this purpose. One scheme includes a laminated structure a plurality of layers, wherein one unit layer is composed of a planar integrated circuit with an insulating layer. This semiconductor-based device is difficult to fabricate because it requires significant crystallinity for each unit of the integrated circuit and the present technique of overgrowing a base semiconductor layer upon an insulator is insufficient to provide the required crystallinity.

SUMMARY OF THE INVENTION

It is an object of the present invention to provide a new type of transistor which includes an ultra-thin Mo—C film and a piezoelectric film. In this invention, the piezoelectric film converts an electrical signal into a mechanical force and the resulting mechanical force affects the electrical property of the ultra-thin Mo—C film, which is a good piezoresistive material, thus producing a current modulation in a constant voltage mode. The device comprises an ultra-thin Mo—C film functioning as a channel for electron flow, with two opposing ends of the Mo—C film functioning as source and drain terminals of the transistor respectively; a piezoelectric film, formed on the Mo—C film, for producing a force in accordance with an electric field provided by a gate voltage; and an electrode film formed on the piezoelectric film, functioning as a gate of the transistor to which the gate voltage is applied to produce the applied electric field, wherein a resistance of the Mo—C film changes in accordance with the force produced in response to the applied gate voltage.

The main component of this invention is the ultra-thin Mo—C film. The electronic properties of a thin metal film usually are not affected significantly by a mechanical stress/strain, unless the thickness of the film becomes very small, amounting to a few atomic distances, such as 0.15~5 nm. It has been found that an ultra-thin Mo—C film with a thickness as small as 0.15 nm still maintains electrical continuity. The film can be prepared on clean insulating or semiconducting substrates on a flat surface by sputtering an Mo—C target directly, or by a reactive-sputtering method with an Mo target in an ambient atmosphere of $Ar/C_2H_2$ mixture gas at a wide range of substrate temperatures.

The electrically continuous and ultra-thin Mo—C film is very sensitive to mechanical forces per unit area because it is ultra-thin and there are few atoms sustaining the force. When the Mo—C film has a thickness of only a few atomic distances, for example about 1 nm, the extremely small mechanical stress/strain can change the atomic distances in the film significantly enough to affect the electrical conductivity of the film, because the distance between atoms is a determining factor of the electrical conductivity for a given material. Therefore, this ultrathin Mo—C film can serve as an excellent piezoresistive material.

Another aspect of the Mo—C film, which is crucial to the invention is that the ultra-thin Mo—C can be easily prepared on substrates with any flat surface of an insulator or semiconductor. The film's quality of piezoresistivity is very weakly dependent on the stoichiometry of $Mo_{0.5+x}C_{0.5-x}$ within the moderate range up to x=0.25 and the deposition temperature as well as the substrate. These properties are essential to the fabrication of the integrated circuits stacked layer by layer to build the laminated structure as mentioned earlier, because each layer unit can be successively fabricated and stacked together to build the laminated structure.

BRIEF DESCRIPTION OF THE DRAWINGS

This invention may be better understood and its objects and advantages will become apparent to those skilled in the art by reference to the accompanying drawings as follows.

DESCRIPTION OF THE PREFERRED EMBODIMENT(S)

Figure 1:
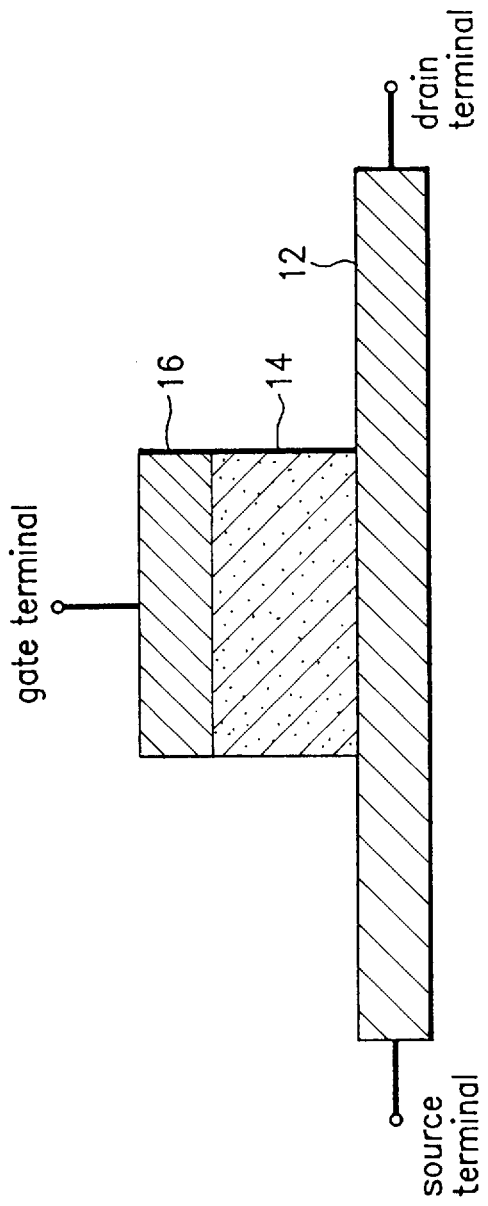
FIG. 1 is a cross-sectional view showing the construction of the transistor device according to one embodiment of the present invention.

Referring to FIG. 1, the piezoelectric device according to the present invention comprises an ultra-thin Mo—C film 12 functioning as a piezoresistive material, a piezoelectric film 14 formed on the thin metal film 12, and an electrode film 16 formed on the piezoelectric film 14. In FIG. 1, the electrode film 16 serves as a gate of a transistor of the present invention, and the two opposing ends of the film 12 serve as a source and a drain of the transistor, respectively.

The operational principles of the device shown in FIG. 1 are as follows: If an electric field is applied between the electrode film 16 and the thin metal film 12 by a gate voltage signal, a vertical mechanical force is produced by the piezoelectric film 14 which affects the resistance of the Mo—C film 12 directly beneath the piezoelectric film 14, which then modulates the current flow between the source and drain at the voltage-bias mode. This new type of transistor presents an alternative to conventional semiconductor-based transistors, and is suitable to the realization of three-dimensional integrated circuits.

Figure 2:
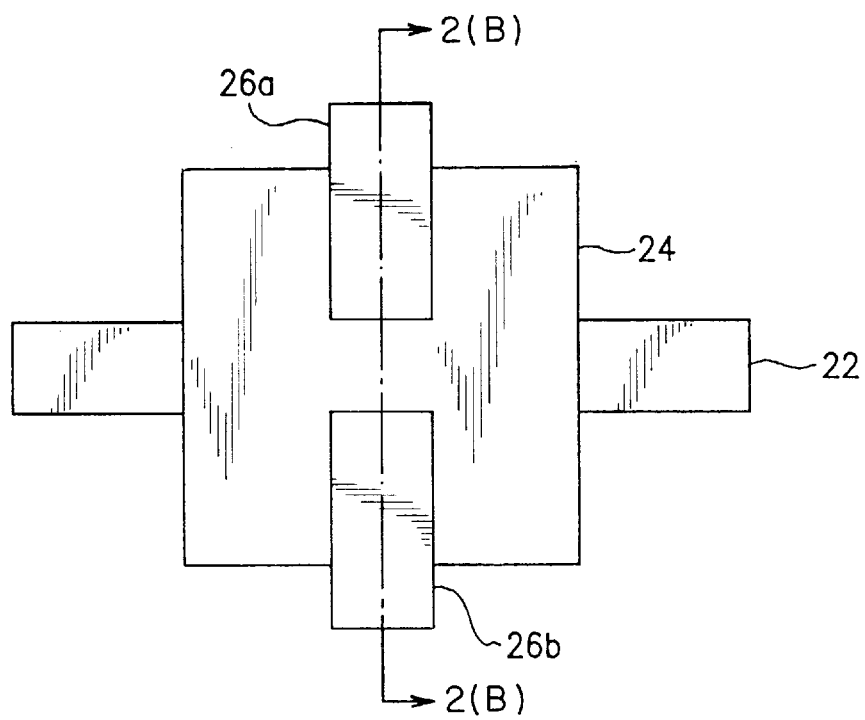
FIG. 2A is a plane view showing the construction of the transistor device according to another embodiment of the present invention.
FIG. 2B is a cross-sectional view of the transistor device taken along A—A line of FIG. 2A.
Figure 2:
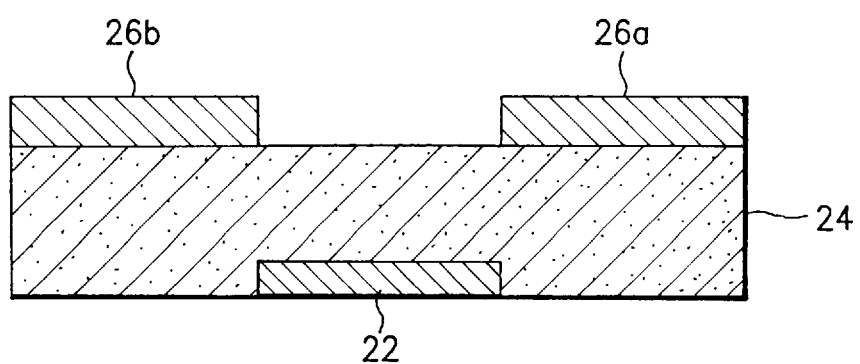

FIGS. 2A and 2B show the construction of a piezoelectric device according to another embodiment of the present invention. With reference to FIGS. 2A and 2B, the piezoelectric device comprises an ultra-thin Mo—C film 22 serving as a piezoresistive material, a piezoelectric film 24 formed on both sides and an upper surface of the ultra-thin Mo—C film 22, and two electrodes 26a and 26b which are formed on the piezoelectric film 24 and are isolated electrically from each other. In this device, if an electric field is applied between the electrodes 26a and 26b, a lateral mechanical force is produced by the piezoelectric film 24. This produced force is applied to the ultra-thin Mo—C film 22 beneath the piezoelectric film 24, and thus a resistance of the ultra-thin Mo—C film 22 is changed.

The method of producing an ultra-thin Mo—C film which may have a nominal thickness of 0.15 to approximately 5 mm for piezoresistive devices may use sputtering onto a Mo—C target disposed on a substrate.

The method of producing an ultra-thin Mo—C film with a normal thickness of 0.15 to approximately 5 mm for piezoresistive devices may use reactive sputtering of an Mo target with a reactive element providing C such as $C_2H_2$ or $CH_4$.

The mole ratio between Mo and C of the above methods of production is between 1:3 to 3:1.

It is understood that various other modifications will be apparent to and can be readily made by those skilled in the art without departing from the scope and the spirit of the invention. Accordingly, it is intended that the scope of the claims appended hereto not be limited to the description as set forth herein, but rather that the claims be construed as encompassing all of the features of patentable novelty that reside in the present invention, including all features that would be treated as equivalents thereof by those skilled in the art which this invention pertains.

What is claimed is:

1. A transistor device comprising:

a Mo—C film functioning as a channel for an electron flow with two ends of the Mo—C film functioning as source and drain terminals of the transistor respectively;

a piezoelectric film, formed on the Mo—C film, for producing a force in accordance with an applied electric field provided by a gate voltage; and an electrode film, formed on the piezoelectric film, functioning as a gate of the transistor to which is applied the gate voltage to produce the applied electric field; and wherein a resistance of the Mo—C film between the source and drain terminals changes in accordance with the force produced in response to the applied gate voltage.

2. A transistor device, comprising:

a thin Mo—C film strip with normal thickness ranging 0.15~5 nm, functioning as a channel for an electron flow, wherein two opposing ends of the Mo—C film strip serve as source and drain terminals of the transistor respectively;

a piezoelectric film, formed on the Mo—C film strip, for producing a vertical force to the metal strip; and an electrode film, formed on the piezoelectric film, functioning as a gate of the transistor to which the gate voltage is applied to produce the applied electric field in the piezoelectric film; wherein a resistance of the Mo—C film strip between the source and drain terminals changes in accordance with the vertical force produced by the piezoelectric film in response to the applied gate voltage.

3. A transistor device in accordance with claim 2 wherein the thin Mo—C film strip is replaced by another thin metal strip which is electrically continuous and has a nominal thickness ranging from 0.1~5 nm.

4. A transistor device, comprising:

a thin Mo—C film strip with normal thickness ranging 0.15~5 nm, functioning as a channel for an electron flow with two ends of the strip serving as source and drain terminals of the transistor respectively;

a piezoelectric film, formed on the Mo—C film strip, for producing a lateral force to the metal strip; and two separate gate electrodes, formed on the piezoelectric film, functioning as a gate of the transistor to which is applied the voltage difference to produce the applied electric field in the piezoelectric film; and wherein a resistance of the Mo—C film strip between the source and drain terminals changes in accordance with the lateral force produced by the piezoelectric film in response to the applied voltage differences between two gate electrodes.

5. A transistor device in accordance with claim 4 wherein the thin Mo—C film strip is replaced by another thin metal strip which is electrically continuous and has a nominal thickness ranging from 0.1~5 nm.

* * * * *